United States Patent [19]

Iwakiri

[11] Patent Number: 5,781,481

[45] Date of Patent: Jul. 14, 1998

[54] SEMICONDUCTOR MEMORY DEVICE WITH REDUCED LEAKAGE CURRENT AND IMPROVED DATA RETENTION

[75] Inventor: Itsuro Iwakiri, Miyazaki, Japan

[73] Assignee: Oki Electric Industry Co., Ltd., Tokyo, Japan

[21] Appl. No.: 742,181

[22] Filed: Oct. 30, 1996

[30] Foreign Application Priority Data

Nov. 7, 1995 [JP] Japan ............................... 7-288790

[51] Int. Cl.$^6$ ................................................. G11C 8/00
[52] U.S. Cl. ..................... 365/189.11; 365/189.09; 365/230.06
[58] Field of Search .................. 365/189.11, 189.09, 365/230.06, 230.08; 326/105, 106, 108

[56] References Cited

U.S. PATENT DOCUMENTS

| | | | |
|---|---|---|---|
| 5,257,238 | 10/1993 | Lee et al. | 365/230.06 |
| 5,410,508 | 4/1995 | McLaury | 365/189.09 |
| 5,416,747 | 5/1995 | Ohira | 365/230.06 |
| 5,617,369 | 4/1997 | Tomishima et al. | 365/230.06 |

Primary Examiner—David C. Nelms
Assistant Examiner—Son Mai
Attorney, Agent, or Firm—Jones & Volentine, L.L.P.

[57] ABSTRACT

A semiconductor memory device has memory cells in which data are represented by a first voltage level and a second voltage level higher than the first voltage level. The memory cells are selected by word lines. When memory cells are not selected, the word lines are driven to a third voltage level lower than the first voltage level.

14 Claims, 6 Drawing Sheets

SEMICONDUCTOR MEMORY DEVICE WITH REDUCED LEAKAGE CURRENT AND IMPROVED DATA RETENTION

BACKGROUND OF THE INVENTION

The present invention relates to a semiconductor memory device, more particularly to the word-line driving circuits thereof.

The invention is especially relevant to dynamic random-access memory (DRAM), which is widely used in computers and other electronic devices. A DRAM memory cell comprises a capacitor for storing an electrical charge representing a bit of data, and a transistor, controlled through a word line, for selectively coupling the capacitor to a bit line. Even when the transistor is on the off-state, charge can slowly leak into or out of the capacitor, resulting in loss of the stored data. The data must therefore be refreshed periodically, as implied by the term "dynamic."

Charge can leak in two ways: as subthreshold current flowing through the transistor between the capacitor and bit line, and as junction leakage current flowing from the capacitor into the substrate in which the transistor is formed. The rates of both types of leakage vary depending on the voltage to which the substrate is biased, but they depend on this bias voltage in opposite ways. Lowering the substrate bias voltage reduces the subthreshold leakage current, but increases the junction leakage current. Raising the substrate bias voltage reduces the junction leakage current, but increases the subthreshold current.

There accordingly exists an optimum substrate bias voltage at which total leakage is minimized. Leakage increases if the substrate voltage is either higher or lower than the optimum voltage. Unfortunately, it is difficult to ensure that the substrate is accurately biased to the optimum voltage, because the bias voltage varies depending on the supply voltage, and also varies depending on fabrication process conditions.

Charge leakage thus remains unsatisfactorily controlled, and to ensure data retention, DRAM memory cells must be refreshed at frequent intervals.

SUMMARY OF THE INVENTION

One object of the present invention to reduce the leakage current in the memory cells of a semiconductor memory device.

Another object of the invention is to improve the data retention characteristics of a dynamic random-access memory.

The invented semiconductor memory device has memory cells selected by word lines, word-line drivers for driving the word lines, and a negative voltage generator. In the memory cells, data are represented by a ground voltage level and a higher voltage level. The negative voltage generator generates a negative voltage level lower than the ground voltage level, and supply this negative voltage level to the word-line drivers. The word-line drivers supply this negative voltage level to the word lines when the word lines and their corresponding memory cells are not selected.

The negative voltage level may also be supplied to the substrate in which the memory cells are formed. Alternatively, a separate substrate bias voltage, also lower than the ground voltage level, may be generated and supplied to this substrate, in which case the negative voltage level supplied to the word-line drivers is preferably lower than the substrate bias voltage level.

BRIEF DESCRIPTION OF THE DRAWINGS

Embodiments of the invention will be described with reference to the attached illustrative drawings, in which.

DETAILED DESCRIPTION OF THE INVENTION

Figure 1:
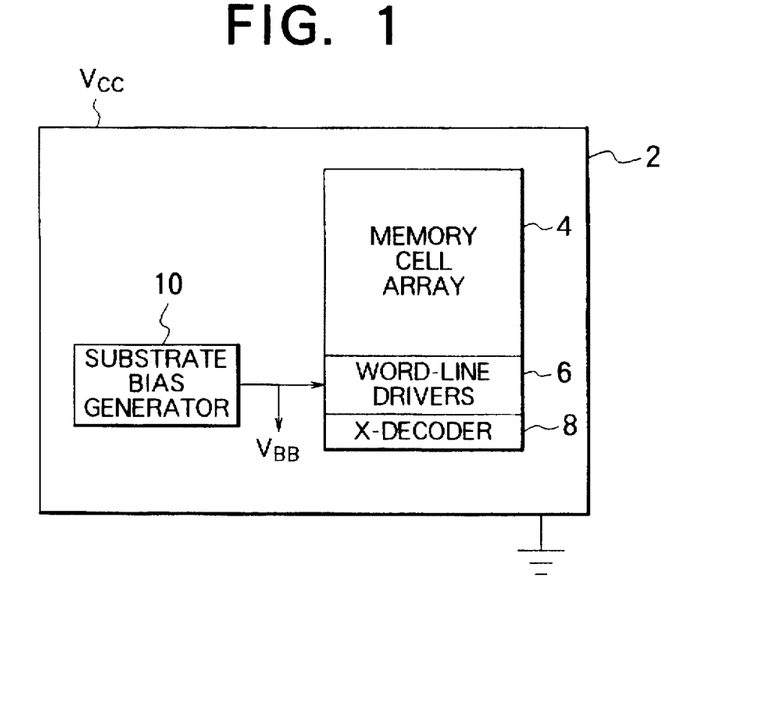
FIG. 1 is a block diagram of a first embodiment of the invention.

Referring to FIG. 1, a first embodiment of the invented semiconductor memory is a DRAM formed on a semiconductor chip 2, having a memory cell array 4, a plurality of word-line drivers 6, an x-decoder 8, and a substrate bias generator 10. Other well-known circuits such as input/output circuits have been omitted to avoid obscuring the invention with irrelevant detail. All of the circuits on the semiconductor chip 2 are driven by power derived from a supply voltage $V_{CC}$ and a ground voltage, the latter denoted in the drawings by the conventional ground symbol.

In the following description, $V_{CC}$ will be five volts (5 V) and the ground voltage will be zero volts (0 V). The invention is not limited to these specific values, however; $V_{CC}$ may have any value that is positive with respect to ground.

The memory-cell array 4 is a row-column array of memory cells linked by word lines running in the row direction (vertically in FIG. 1) and bit lines running in the column direction (horizontally in FIG. 1). Schematic diagrams of memory cells will be shown later. The memory cell array 4 comprises n-channel metal-oxide-semiconductor (NMOS) transistors which are formed in a p-type substrate. The substrate bias generator 10 generates and supplies to this p-type substrate a bias voltage $V_{BB}$ that is negative with respect to the ground voltage. For example, $V_{BB}$ may be about −2.5 V.

Figure 2:
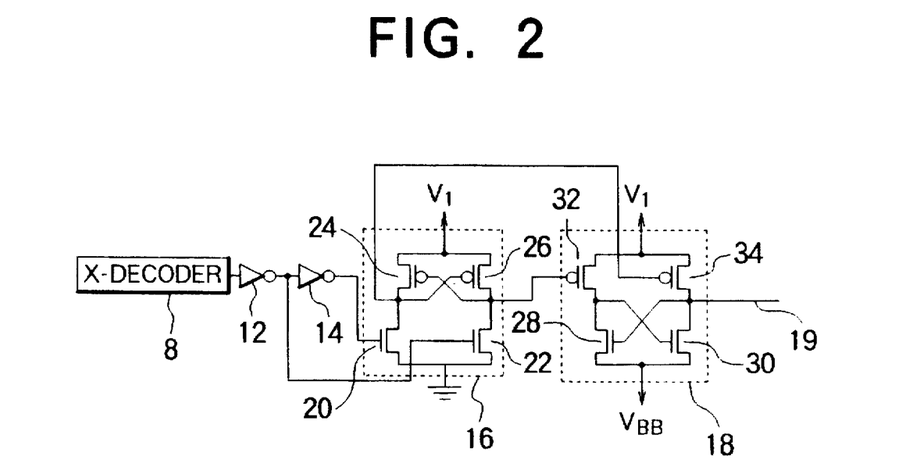
FIG. 2 is a more detailed schematic diagram of one of the word-line drivers in FIG. 1.

FIG. 2 shows the circuit configuration of one of the word-line drivers 6 in FIG. 1. One circuit of this type is provided for each word line. From the x-decoder 8, this circuit receives a signal with a voltage level that is high or low depending on whether a word line is to be driven or not. The low voltage level is the ground level. The high voltage level is a fixed voltage level exceeding the ground level but not exceeding the $V_{CC}$ level. In the following description it will be assumed that the high level is equal to $V_{CC}$, although this is not a restriction.

The signal from the x-decoder 8 is inverted by a pair of inverters 12 and 14 coupled in series to produce complementary output signals. The output of one of these inverters 12 and 14 is low (ground level) while the output of the other inverter is at the high level (e.g. $V_{CC}$) described above.

The complementary outputs of these inverters 12 and 14 are supplied to a first level-shifting circuit 16, which also produces complementary output signals. The complementary output signals of the first level-shifting circuit 16 are supplied to a second level-shifting circuit 18. The second level-shifting circuit 18 produces a single output that drives a word line 19.

The first level-shifting circuit 16 comprises a pair of NMOS transistors 20 and 22 and a pair of p-channel metal-oxide-semiconductor (PMOS) transistors 24 and 26 that are cross-coupled as follows. The sources of NMOS transistors 20 and 22 are coupled to ground. The gate of NMOS transistor 20 receives the output of inverter 14, while the gate of NMOS transistor 22 receives the output of inverter 12. The drain of NMOS transistor 20 is coupled to the drain of PMOS transistor 24 and to the gate of PMOS transistor 26. The drain of NMOS transistor 22 is coupled to the drain of PMOS transistor 26 and to the gate of PMOS transistor 24. The sources of PMOS transistors 24 and 26 receive a boosted voltage $V_1$ higher than the above-described high level. $V_1$ is, for example, equal to or greater than $V_{CC}$.

The second level-shifting circuit 18 comprises NMOS transistors 28 and 30 and PMOS transistors 32 and 34 which are also cross-coupled. The sources of NMOS transistors 28 and 30 are coupled to the substrate bias generator 10 and receive the negative substrate bias voltage $V_{BB}$. The sources of PMOS transistors 32 and 34 receive the boosted voltage $V_1$. The gate of PMOS transistor 32 receives the voltage output at the drains of transistors 22 and 26 in the first level-shifting circuit 16. The gate of PMOS transistor 34 receives the voltage output at the drains of transistors 20 and 24 in the first level-shifting circuit 16. The drain of PMOS transistor 32 is coupled to the drain of NMOS transistor 28 and to the gate of NMOS transistor 30. The drain of PMOS transistor 34 is coupled to the drain of NMOS transistor 30 and to the gate of NMOS transistor 28. The drains of NMOS transistor 30 and PMOS transistor 34 are coupled to the word line 19.

Next, the operation of the first embodiment will be described.

When the memory is not being accessed, all outputs of the x-decoder 8 are low. In FIG. 2, the output of inverter 12 is accordingly high while the output of inverter 14 is low (ground level). As a result, in the first level-shifting circuit 16, transistors 22 and 24 are switched on, transistors 20 and 26 are off, the drains of transistors 20 and 24 are at the boosted $V_1$ level, and the drains of transistors 22 and 26 are at ground level. In the second level-shifting circuit 18, transistors 30 and 32 are on, transistors 28 and 34 are off, and the drains of transistors 30 and 34 are therefore at the $V_{BB}$ level. The word line 19 is accordingly held at the $V_{BB}$ level.

Figure 3:
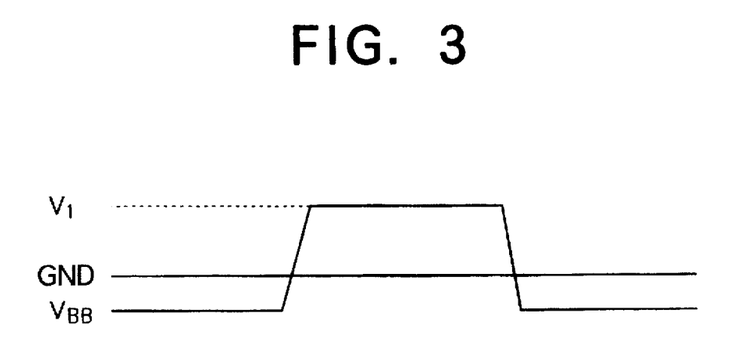
FIG. 3 is a waveform diagram illustrating the driving of a word line in the first embodiment.

When the memory is accessed, the x-decoder sends a high output signal to one of the word-line drivers 6, reversing the outputs of the inverters 12 and 14 of this line driver, to select the coupled word line 19. The on-off relationships of all transistors in the level-shifting circuits 16 and 18 of this word-line driver are thereby reversed, and the coupled word line 19 is driven to the boosted $V_1$ level. The driving of this word line is illustrated in FIG. 3. Other word lines remain at the negative $V_{BB}$ level.

Next, the effect of the first embodiment in reducing leakage from memory cells will be described with reference to FIGS. 4 to 8.

Figure 4:
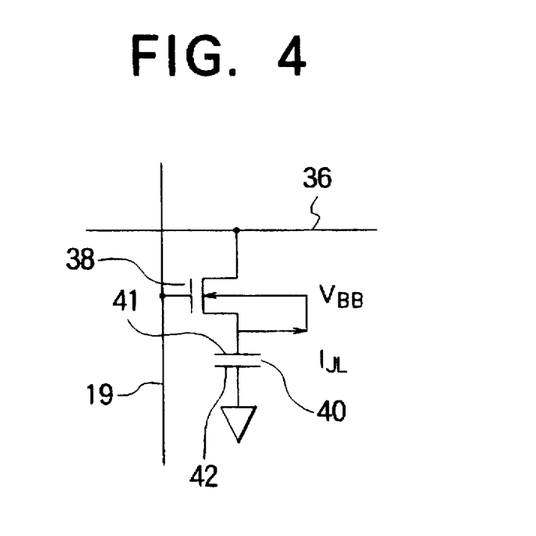
FIG. 4 is a schematic diagram of a memory cell, illustrating junction leakage current.

FIG. 4 is a schematic diagram of a memory cell coupled to a word line 19 and bit line 36. The memory cell comprises a transfer transistor 38 of the NMOS type, and a capacitor 40. The bit line 36 is coupled through the transfer transistor 38 to one plate 41 of the capacitor 40. The other plate 42 of the capacitor 40 is coupled to a fixed potential, such as the ground potential or any other convenient fixed voltage level. The gate of the transfer transistor 38 is coupled to the word line 19.

The transfer transistor 38 controls read and write access to the memory cell. The capacitor 40 functions as a data storage element. In the writing of data, the word line 19 is driven to the boosted $V_1$ level, the transfer transistor 38 is thereby switched on, and the capacitor 40 is charged through the bit line 36 to the above-described high voltage level to store a logic "one," or to the low (ground) level to store a logic "zero." When the transfer transistor 33 is turned off, the capacitor 40 remains at the high or low level while the bit line 36 is precharged to and held at a level (e.g. 2.5 V) intermediate between the high and low levels.

The part of the transfer transistor 38 coupled to the capacitor 40 can function as either the source or drain region; in either case, this part is an n-type diffusion region formed in the p-type substrate mentioned earlier. Since capacitor plate 41 is charged to the ground level or a higher voltage level, and the p-type substrate is at the lower $V_{BB}$ level, current should not flow across the pn junction between the n-type diffusion region and the p-type substrate. Due to causes such as defects in semiconductor crystal structure, however, a small junction leakage current $I_{JL}$ is present. If the capacitor is charged to the high level to store a logic "one" value, this junction leakage current $I_{JL}$ discharges the capacitor toward the logic "zero" level.

Figure 5:
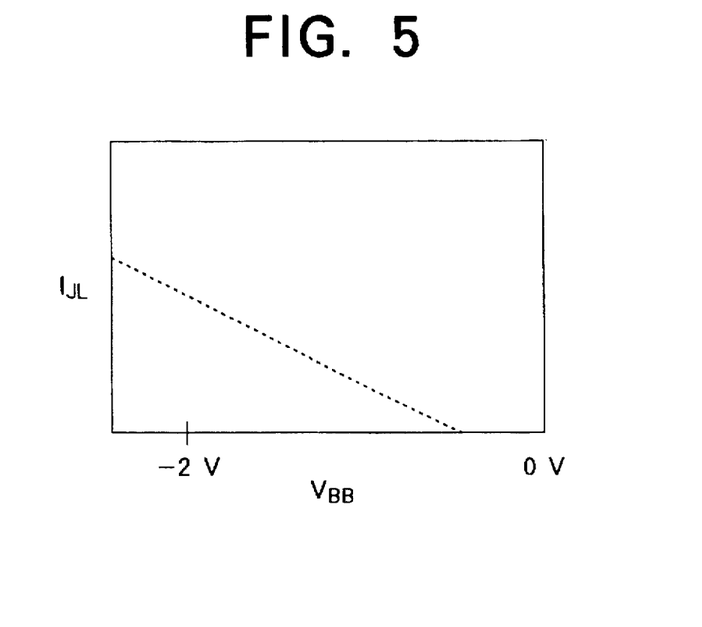
FIG. 5 is a graph illustrating the dependence of junction leakage current on substrate bias voltage.

FIG. 5 illustrates the effect of the substrate bias voltage on the junction leakage current. The substrate bias voltage $V_{BB}$ is shown on the horizontal axis, and the junction leakage current $I_{JL}$ on the vertical axis. The vertical scale has been omitted, as FIG. 5 is intended simply to show that $I_{JL}$ decreases as $V_{BB}$ rises toward the ground level (0 V).

Figure 6:
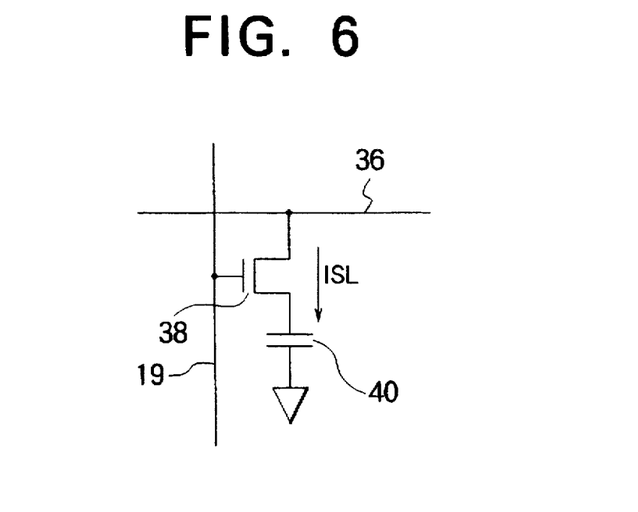
FIG. 6 is a schematic diagram of a memory cell, illustrating subthreshold leakage current.

FIG. 6 illustrates the flow of subthreshold leakage current $I_{SL}$ in the same memory cell when the capacitor 40 has been charged to the low level to store a logic "zero." In this state the source of the transfer transistor 38 (the region coupled to the capacitor 40) is at the ground level, the drain is at the above-described intermediate level (e.g. 2.5 $V_{CC}$), and even when the transfer transistor 38 is switched off, a small subthreshold current $I_{SL}$ leaks through from the bit line, due to weak inversion in the transistor channel. This subthreshold leakage current charges the capacitor toward the logic "one" state.

If the capacitor 40 is originally charged to the high level to store a logic "one" value, the subthreshold current flows in the opposite direction, discharging the capacitor toward the logic "zero" state. This discharge subthreshold current is smaller, however, because the gate voltage of the transfer transistor 38 is far below both the source and drain voltages.

Figure 7:
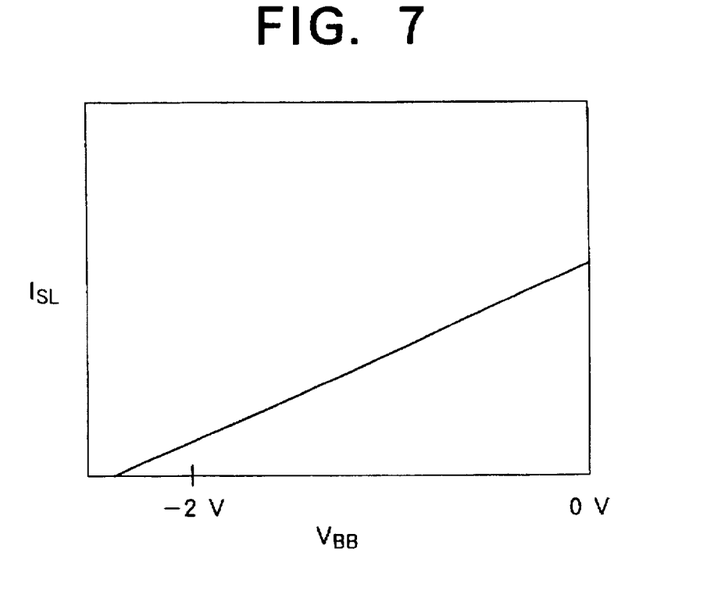
FIG. 7 is a graph illustrating the dependence of subthreshold leakage current on substrate bias voltage.

FIG. 7 illustrates the effect of the substrate bias voltage $V_{BB}$ on the subthreshold leakage current $I_{SL}$, showing $V_{BB}$ on the horizontal axis and $I_{SL}$ on the vertical axis. Again the vertical scale is omitted, but FIG. 7 shows that $I_{SL}$ increases as $V_{BB}$ rises toward ground level (0 V).

Figure 8:
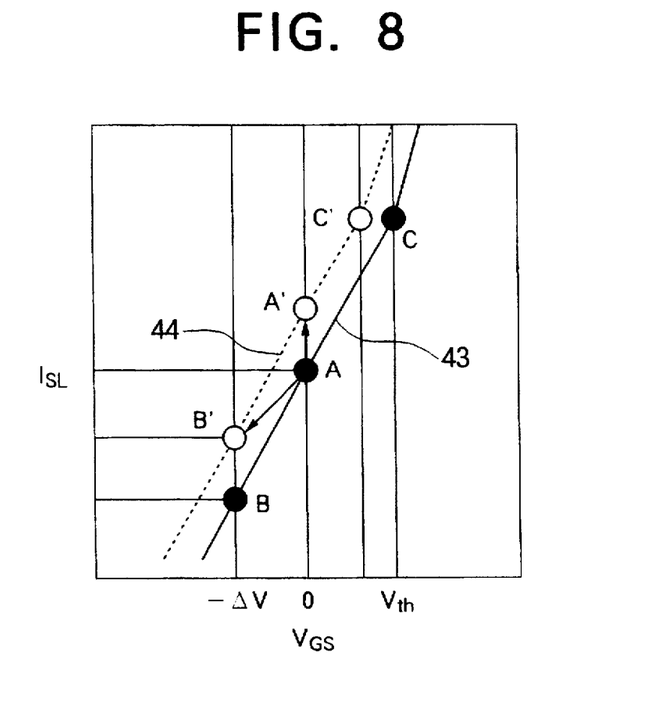
FIG. 8 is a graph illustrating the effect of the first embodiment.

FIG. 8 illustrates the dependence of the subthreshold leakage current $I_{SL}$ on the gate-source voltage $V_{GS}$ of the transfer transistor 38 when a logic "zero" is stored in the capacitor 40, showing $V_{GS}$ on the horizontal axis and $I_{SL}$ on the vertical axis. The word-line voltage level in the non-selected state is indicated by the symbol $-\Delta$ V. The threshold voltage of the transfer transistor 38 is indicated by the symbol $V_{th}$.

The darker curve 43 illustrates the $I_{SL}$-$V_{GS}$ characteristic with the relatively deep substrate bias $V_{BB}$ employed in conventional memory devices. This $V_{BB}$ exceeds $-\Delta$ V in the negative direction. If the word line 19 is held at the conventional ground level, then in the non-selected state, since the capacitor 40 is also charged to ground level, $V_{GS}$ is zero, and the memory cell operates at point A. If the word-line potential is changed to the value $-\Delta$ V employed in the first embodiment, however, the memory cell operates at point B and the subthreshold leakage current $I_{SL}$ is greatly reduced.

The lighter curve 44 illustrates the case of the more shallow substrate bias voltage employed in the first embodiment, when $V_{BB}$ is equal to $-\Delta$ V. In the non-selected state, with the conventional ground-level word-line voltage, the memory cell would operate at point A' and the subthreshold leakage current $I_{SL}$ would be unacceptably high. In the first embodiment, however, the memory cell operates at point B', so the subthreshold leakage current $I_{SL}$ is still reduced as compared with point A.

The first embodiment thus enables the substrate bias voltage $V_{BB}$ to be raised closer to ground level and the subthreshold leakage current $I_{SL}$ to be reduced simultaneously. Raising the substrate bias also reduces the junction leakage current $I_{JL}$, as shown in FIG. 5, thereby reducing harmful leakage when the capacitor 40 stores logic "one" data. By reducing both junction and subthreshold leakage current, the first embodiment reduces leakage regardless of whether a logic "zero" or a logic "one" is stored in the memory cell, thereby lengthening the time for which the data can be retained.

A further benefit of raising the substrate bias voltage is that the threshold voltage is reduced: the transfer transistor 38 turns on at point C' instead of point C in FIG. 8.

Next, a second embodiment will be described with reference to FIGS. 9 to 11.

Figure 9:
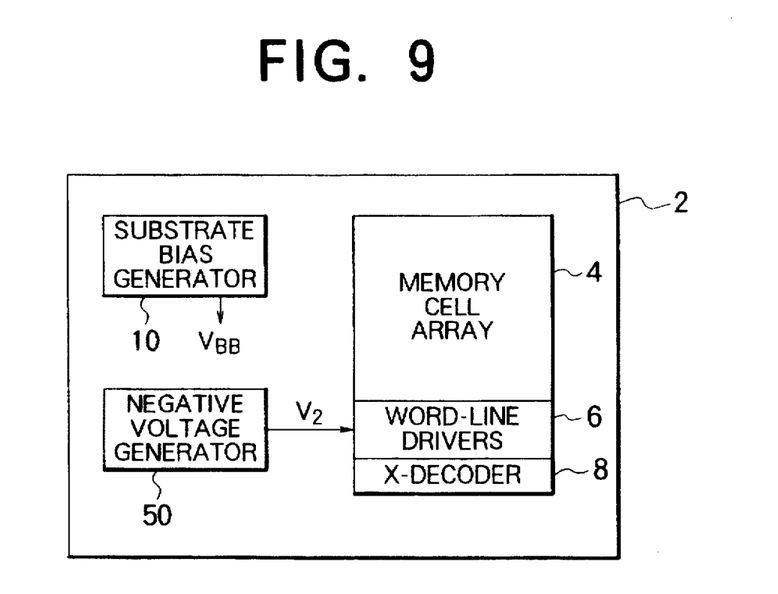
FIG. 9 is a block diagram of a second embodiment of the invention.

Referring to FIG. 9, the second embodiment integrates a memory cell array 4, word-line drivers 6, an x-decoder 8, and a substrate bias generator 10 onto a semiconductor chip 2 as in the first embodiment, but does not couple the substrate bias generator 10 to the line drivers 6. Instead, a separate negative voltage generator 50 generates another negative voltage $V_2$, and $V_2$ is provided to the word-line drivers 6 while the substrate is biased to $V_{BB}$.

The negative voltage generator 50 may have a circuit configuration generally similar, for example, to that of the well-known substrate bias generator 10. The negative voltage $V_2$ is independent of the substrate bias voltage $V_{BB}$, however, so these two voltages $V_2$ and $V_{BB}$ can be optimized to different values.

Figure 10:
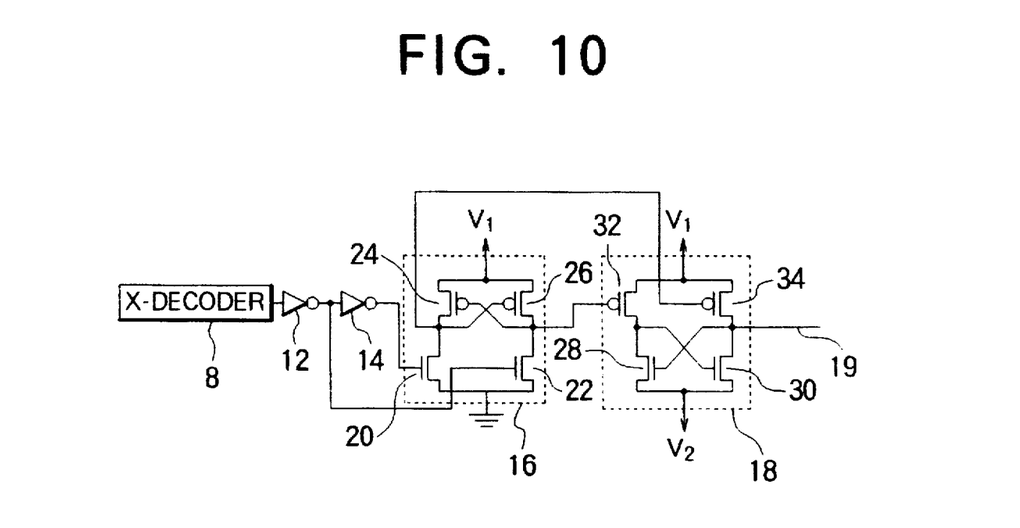
FIG. 10 is a more detailed schematic diagram of one of the word-line drivers in FIG. 9.

Referring to FIG. 10, the word-line drivers 6 have the same configuration as in the first embodiment, except that instead of $V_{BB}$, the negative voltage $V_2$ generated by the negative voltage generator 50 is supplied to the sources of NMOS transistors 28 and 30.

Figure 11:
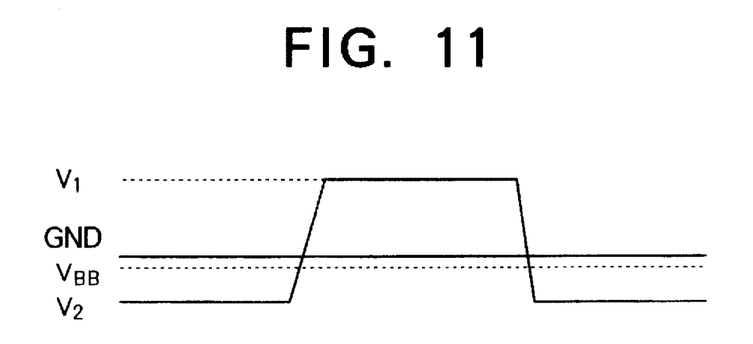
FIG. 11 is a waveform diagram illustrating the driving of a word line in the second embodiment.

$V_{BB}$ and $V_2$ are related as shown in FIG. 11, which illustrates the driving of a word line. Specifically, $V_2$ is lower (more negative) than $V_{BB}$. $V_2$ is also lower than the $V_{BB}$ in the first embodiment, while the $V_{BB}$ in the second embodiment is higher than the $V_{BB}$ in the first embodiment. By generating $V_{BB}$ and $V_2$ separately, the second embodiment enables both to be optimized independently. Junction leakage current can be reduced by optimizing $V_{BB}$, and subthreshold current by optimizing $V_2$.

Figure 12:
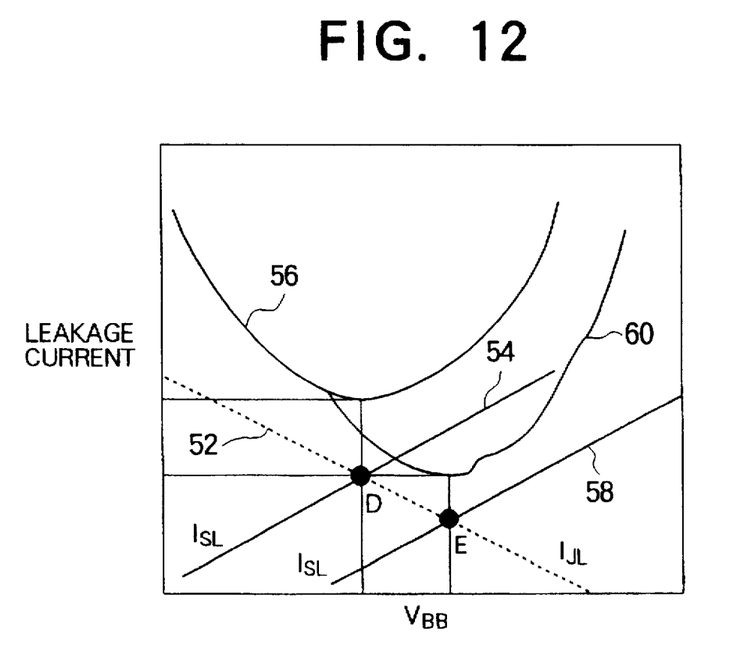
FIG. 12 is a graph comparing the effects of the first and second embodiments.

FIG. 12 compares the effects of the first and second embodiments, showing the substrate bias voltage $V_{BB}$ on the horizontal axis and leakage current on the vertical axis. The junction leakage characteristic 52 is the same in both embodiments. In the first embodiment, in which non-selected word lines are held at the substrate bias voltage $V_{BB}$, the subthreshold leakage characteristic 54 intersects the junction leakage characteristic 52 at a point D. Minimum overall leakage current is obtained at the $V_{BB}$ value corresponding to point D, as indicated by curve 56. In the second embodiment, in which the non-selected word lines are held at the lower voltage $V_2$, the junction leakage characteristic 58 is shifted to the right, and minimum overall leakage current is obtained at the higher $V_{BB}$ value corresponding to point E, as indicated by curve 60.

As noted earlier, it is difficult to control the substrate bias voltage $V_{BB}$ precisely. As FIG. 12 shows, however, for any $V_{BB}$ value in the general vicinity of point E, even for the $V_{BB}$ corresponding to point D, the second embodiment allows less current to leak than does the first embodiment. Both embodiments, of course, improve on the prior art, in which the word lines are grounded and the subthreshold leakage characteristic is located farther to the left than either of illustrated characteristics 54 and 58.

The present invention accordingly succeeds in reducing leakage from dynamic memory cells, thereby lengthening data retention times, without demanding precise control of the substrate bias voltage. As a result, refresh intervals can be lengthened.

The benefits of the invention go beyond reducing the frequency with which refreshing is required. By reducing leakage current, the invention also reduces current consumption, an important consideration when data must be retained in the memory device under battery back-up. The invention also reduces the amount of charge that must be stored to retain data for a given time, thereby reducing the required capacitance, hence the necessary size of the capacitor 40, and enabling smaller memory cells to be fabricated.

It should be noted that the inventive concepts can also be applied to reduce current consumption by reducing leakage current in certain types of static memory devices, such as those with high-resistance loads or thin-film transistors.

Those skilled in the art will recognize that further variations are possible within the scope claimed below.

What is claimed is:

1. A semiconductor memory device having a substrate, data storage elements in which data are represented by a first voltage level and a second voltage level higher than the first voltage level, transfer transistors formed in said substrate for controlling access to said data storage elements, word lines for controlling said transfer transistors, word-line drivers for driving respective word lines, a decoder for selecting said word lines, and a substrate bias generator for generating a third voltage level lower than said first voltage level and supplying said third voltage level to said substrate, comprising:

a negative voltage generator coupled to said word-line drivers, for generating a fourth voltage level substantially lower than said third voltage level and supplying said fourth voltage level to said word-line drivers, said voltage generator being independent of said substrate bias generator; wherein each of said word-line drivers has a level-shifting circuit for receiving a signal from said decoder and supplying said fourth voltage level to a corresponding one of said word lines, thereby turning off a corresponding one of said transfer transistors, responsive to the signal received from said decoder.

2. The semiconductor memory device of claim 1, wherein said data storage elements are capacitors.

3. The semiconductor memory device of claim 2, wherein said semiconductor memory device is a dynamic random-access memory device.

4. The semiconductor memory device of claim 1, wherein said level-shifting circuit comprises:

a pair of PMOS transistors; and a pair of NMOS transistors cross-coupled to said pair of PMOS transistors, said fourth voltage level being supplied to said NMOS transistors.

5. The semiconductor memory device of claim 1, wherein said first voltage level is a ground voltage level.

6. A method of driving word lines of a semiconductor memory circuit having memory cells which are formed in a substrate and selected by said word lines, wherein said data in said memory cells are represented by a first voltage level and a second voltage level higher than the first voltage level, comprising the steps of:

generating a third voltage level lower than said first voltage level;

supplying said third voltage level to said substrate;

generating a fourth voltage level substantially lower than said third voltage level, said fourth voltage level being independent of said third voltage level; and supplying a said fourth voltage level to one of said word lines which is not selected.

7. The method of claim 6, wherein said semiconductor memory circuit is a dynamic random-access memory.

8. The semiconductor memory device of claim 6, wherein said first voltage level is a ground voltage level.

9. A semiconductor memory device comprising:

a memory cell for storing data represented by a first voltage level and a second voltage level higher than the first voltage level, said memory cell being formed in a substrate;

a word line coupled to said memory cell, for receiving a word line selection signal that takes on a third voltage level and a fourth voltage level, the third voltage level being lower than the first voltage level and the fourth voltage level being higher than the second voltage level;

a substrate bias generator for generating a fifth voltage level substantially between the first voltage level and the third voltage level and supplying the fifth voltage level to said substrate;

a negative voltage generator independent of said substrate bias generator, for generating the third voltage level; and a word-line driver circuit coupled to said word line, for outputting the word line selection signal at said third voltage level to said word line when said memory cell is not selected, and for outputting the word line selection signal at said fourth voltage level to said word line when said memory cell is selected.

10. The semiconductor memory device of claim 9, wherein said third voltage level and said fifth voltage level are negative voltage levels.

11. The semiconductor memory device of claim 10, wherein said semiconductor memory device is a dynamic random-access memory.

12. The semiconductor memory device of claim 9, wherein said first voltage level is a ground voltage level.

13. The semiconductor memory device of claim 12, wherein said semiconductor memory device is a dynamic random-access memory.

14. The semiconductor memory device of claim 9, wherein said semiconductor memory device is a dynamic random-access memory.

* * * * *